US012757507B2

(12) United States Patent
Cha

(10) Patent No.: US 12,757,507 B2
(45) Date of Patent: Oct. 6, 2026

(54) IMAGE SENSING DEVICE HAVING A CROSS-TALK SENSING PIXEL GROUP

(71) Applicant: SK hynix Inc., Gyeonggi-do (KR)

(72) Inventor: Su Ram Cha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 593 days.

(21) Appl. No.: 17/979,895

(22) Filed: Nov. 3, 2022

(65) Prior Publication Data

US 2024/0014232 A1 Jan. 11, 2024

(30) Foreign Application Priority Data

Jul. 11, 2022 (KR) ........................ 10-2022-0084953

(51) Int. Cl.

*H10F 39/00* (2025.01)
*H10F 39/18* (2025.01)

(52) U.S. Cl.

CPC ....... *H10F 39/8053* (2025.01); *H10F 39/182* (2025.01); *H10F 39/8063* (2025.01)

(58) Field of Classification Search

CPC ............... H10F 39/8053; H10F 39/182; H10F 39/8063; H10F 39/8023; H10F 39/802; H10F 39/8037

See application file for complete search history.

(56) References Cited

U.S. PATENT DOCUMENTS

2008/0129856 A1* 6/2008 Kim ....................... G02B 5/201 348/308
2009/0086065 A1 4/2009 Kim et al.
2014/0078366 A1* 3/2014 Dokoutchaev ....... H04N 25/133 348/302
2015/0381951 A1* 12/2015 Mlinar ................. H04N 23/672 348/223.1
2016/0173835 A1* 6/2016 Cha ........................ H04N 25/62 348/280
2018/0227550 A1* 8/2018 Fossum .................. H04N 25/77
2022/0028910 A1 1/2022 Lee et al.

FOREIGN PATENT DOCUMENTS

KR 10-2016-0072508 A 6/2016
WO 2021/157237 A1 8/2021

OTHER PUBLICATIONS

Office Action for Chinese Patent Application No. 202310091667.6 issued by the Chinese Patent Office on May 13, 2026.

* cited by examiner

*Primary Examiner* — Marlon T Fletcher
*Assistant Examiner* — Da Wei Lee
(74) *Attorney, Agent, or Firm* — IP&T GROUP LLP

(57) ABSTRACT

An image sensing device includes a pixel array including a plurality of unit pixel blocks arranged in a matrix form. Each of the unit pixel blocks includes a plurality of imaging pixel groups and a cross-talk sensing pixel group. The cross-talk sensing pixel group includes a first green sensing pixel including a first green color filter and a first yellow color filter; a red sensing pixel including a second yellow color filter and a red color filter; a blue sensing pixel including a blue color filter and a first cyan color filter; and a second green sensing pixel including a second cyan color filter and a second green color filter.

19 Claims, 18 Drawing Sheets

| | j-1 | j | j+1 |
|---|---|---|---|
| i-1 | i-1, j-1 | i-1, j | i-1, j+1 |
| i | i, j-1 | i, j | i, j+1 |
| i+1 | i+1, j-1 | i+1, j | i+1, j+1 |

IMAGE SENSING DEVICE HAVING A CROSS-TALK SENSING PIXEL GROUP

The present application claims priority of Korean Patent Application No. 10-2022-0084953, filed on Jul. 11, 2022, which is incorporated herein by reference in its entirety.

BACKGROUND

1. Field

Various embodiments of the present disclosure provides an image sensing device having a cross-talk sensing pixel group.

2. Description of the Related Art

As the resolution of the image sensing device increases and pixels of the image sensing device become miniaturized, the cross-talk between pixels has emerged as an important problem.

SUMMARY

An embodiment of the present disclosure provides an image sensing device having a cross-talk sensing pixel group.

An embodiment of the present disclosure provides a method of correcting cross-talk of an image sensing device.

In accordance with an embodiment of the present disclosure, an image sensing device includes a pixel array including a plurality of unit pixel blocks arranged in a matrix form. Each of the unit pixel blocks includes a plurality of imaging pixel groups and a cross-talk sensing pixel group. The cross-talk sensing pixel group includes a first green sensing pixel including a first green color filter and a first yellow color filter; a red sensing pixel including a second yellow color filter and a red color filter; a blue sensing pixel including a blue color filter and a first cyan color filter; and a second green sensing pixel including a second cyan color filter and a second green color filter.

In accordance with an embodiment of the present disclosure, an image sensing device includes a plurality of unit pixel blocks arranged in a matrix form. Each of the unit pixel blocks includes a plurality of imaging pixel groups and a cross-talk sensing pixel group. The cross-talk sensing pixel group includes a first half green sensing pixel; a first half yellow sensing pixel; a second half yellow sensing pixel; a half red sensing pixel; a half blue sensing pixel; a first half cyan sensing pixel; a second half cyan sensing pixel; and a second half green sensing pixel.

In accordance with an embodiment of the present disclosure, an image sensing device includes a substrate; photodiodes formed in the substrate; a planarization layer formed on an upper surface of the substrate; color filters formed on the planarization layer; and micro lenses formed on the color filters. The color filters include imaging color filters selectively including one of a green color, a red color, and a blue color; and cross-talk sensing color filters selectively including one of a yellow color and a cyan color.

DETAILED DESCRIPTION

Figure 1:
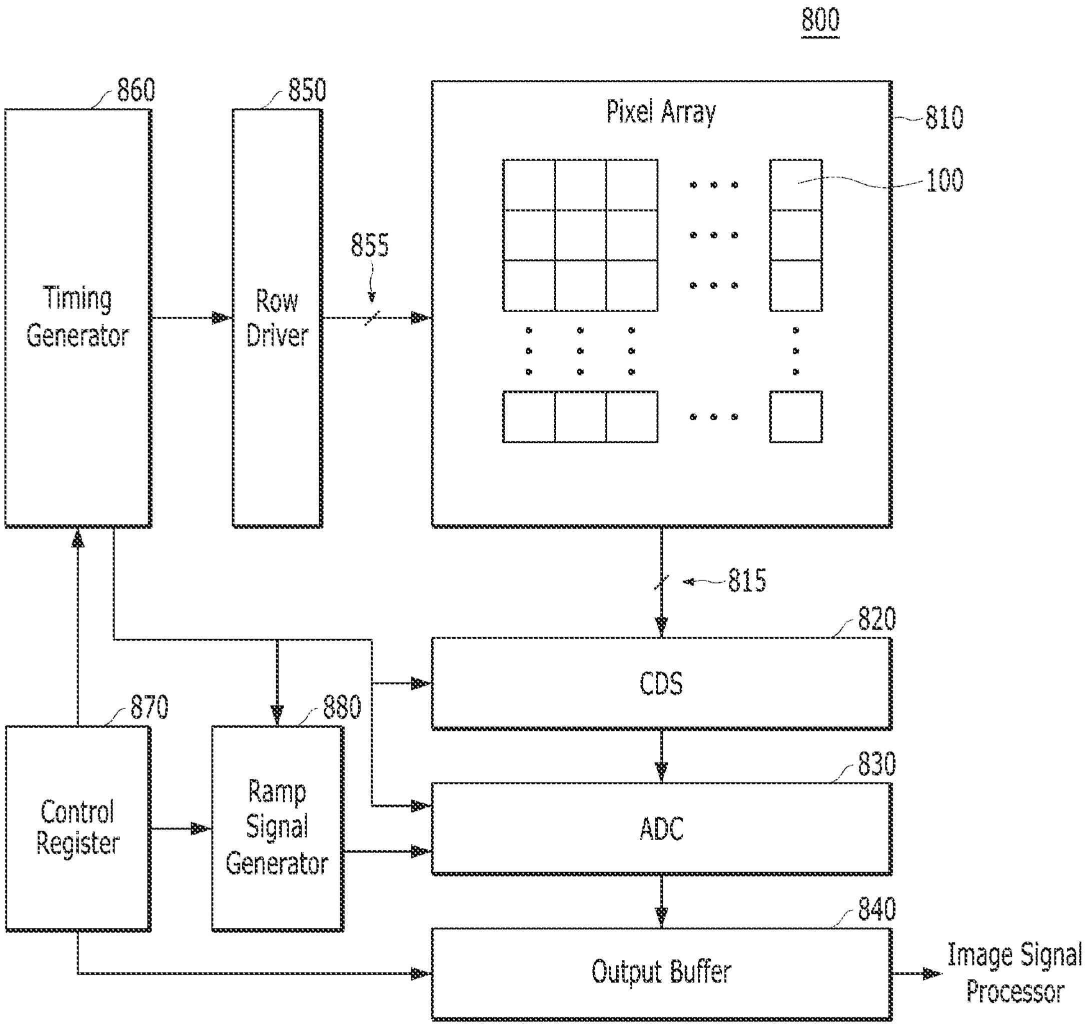
FIG. 1 is a block diagram schematically illustrating an image sensing device according to an embodiment of the present disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that, although the terms “first” and/or “second” may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that describe the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a block diagram schematically illustrating an image sensing device 800 according to an embodiment of the present disclosure. Referring to FIG. 1, an image sensing device 800 according to an embodiment of the present disclosure may include a pixel array 810, a correlated double sampler (CDS) 820, an analog-to-digital converter (ADC) 830, an output buffer 840, a row driver 850, a timing generator 860, a control register 870, and a ramp signal generator 880.

The pixel array 810 may include a plurality of unit pixel blocks 100 arranged in a matrix form. Each of the unit pixel blocks 100 may convert optical image information into electrical image signals. The electrical image signals may be provided to the correlated double sampler 820 from the unit pixel blocks 100 of the pixel array 810 through a plurality of column lines 815. Each of the unit pixel blocks 100 may include a plurality of unit pixels. Each of the plurality of unit pixels may sense at least one color and convert it into an electrical image signal. Each of the unit pixel blocks 100 may have at least one cross-talk sensing pixel group to sense cross-talk intensity between unit pixels.

The correlated double sampler 820 may temporarily store and sample the electrical image signals received from the unit pixel blocks 100. For example, the correlated double sampler 820 may sample a reference voltage level and voltage levels of the received electrical image signals according to timing signals received from the timing generator 860 and provide analog signals corresponding to differences between the reference voltage level and the voltage levels to the analog-to-digital converter 830. The analog-to-digital converter 830 may convert the analog signals received from the correlated double sampler 820 into digital signals and provide the digital signals to the output buffer 840. The output buffer 840 may latch the digital signals received from the analog-to-digital converter 830 and sequentially provide the digital signals to an external image signal processor. The output buffer 840 may include a memory to hold or latch the digital signals and sense amplifiers to amplify the digital signals. The row driver 850 may drive the unit pixel blocks 100 in the pixel array 810 according to the timing signals of the timing generator 860. For example, the row driver 850 may generate selection signals to select each of the plurality of row lines 855 and driving signals to drive the unit pixel blocks 100 through the selected row lines 855. The timing generator 860 may generate the timing signals to control the correlated double sampler 820, the analog-to-digital converter 830, the row driver 850, and the ramp signal generator 880. The control register 870 may generate control signals to control the output buffer 840, the timing generator 860, and the ramp signal generator 880. The ramp signal generator 880 may generate ramp signals to control the image signals output from the output buffer 840 according to the control of the timing generator 860.

Figure 2A:
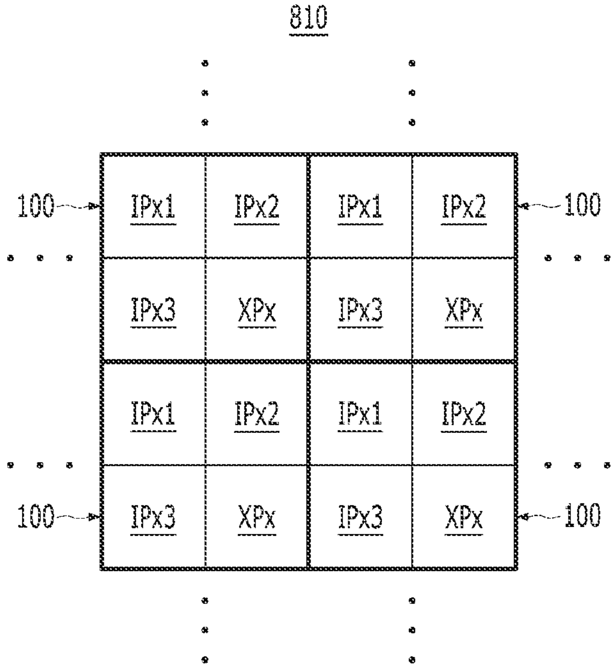
FIG. 2A is a diagram illustrating an arrangement of pixel groups of the unit pixel block of the pixel array of the image sensing device according to an embodiment of the present disclosure.

FIG. 2A is a diagram illustrating an arrangement of pixel groups IPx1-IPx3 and XPx of the unit pixel block 100 of the pixel array 810 of the image sensing device 800 according to the embodiment of the present disclosure. Referring to FIG. 2A, the pixel array 810 of the image sensing device 800 according to an embodiment of the present disclosure may include a plurality of unit pixel blocks 100 arranged in a matrix form having a plurality of rows and a plurality of columns. Each of the unit pixel blocks 100 may include pixel groups IPx1-IPx3 and XPx arranged in a matrix form having two rows and two columns. The pixel groups IPx1-IPx3 and XPx may include imaging pixel groups IPx1-IPx3 and a cross-talk sensing pixel group XPx. The cross-talk sensing pixel group XPx may be arranged at one of an upper-left position (first row, first column), an upper-right position (first row, second column), a lower-left position (second row, first column), and a lower-right position (second rows, second column) of the unit pixel block 100. In the present embodiment, it is illustrated that the cross-talk sensing pixel group XPx is arranged at the lower-right position (i.e., second row and second column) of the matrix form having the two rows and two columns to easily understand the inventive concepts of the present disclosure.

Figure 2B:
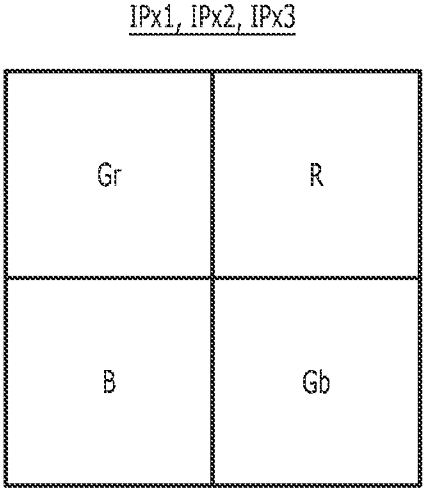
FIG. 2B is a diagram illustrating an arrangement of the unit pixels (i.e., color filters) in the imaging pixel groups of the unit pixel block of the image sensing device according to an embodiment of the present disclosure.

FIG. 2B is a diagram illustrating an arrangement of the unit pixels (i.e., color filters) Gr, R, B, and Gb in the imaging pixel groups IPx1-IPx3 of the unit pixel block 100 of the image sensing device 800 according to an embodiment of the present disclosure. Referring to FIG. 2B, the imaging pixel groups IPx1-IPx3 of the unit pixel block 100 of the image sensing device 800 according to an embodiment of the present disclosure may include a Bayer structured pixel array (i.e., color filter array). Specifically, the imaging pixel groups IPx1-IPx3 may include a first green pixel Gr (i.e., a first green color filter), a red pixel R (i.e., a red color filter), a blue pixel B (i.e., a blue color filter), and a second green pixel Gb (i.e., a second green color filter) which are arranged in a matrix form having two rows and two columns. The first green pixel Gr and the red pixel R may be adjacent to each other in a row direction. The blue pixel B and the second green pixel Gb may be adjacent to each other in the row direction. The first green pixel Gr and the blue pixel B may be adjacent to each other in a column direction. The red pixel R and the second green pixel Gb may be adjacent to each other in the column direction. The first green pixel Gr and the second green pixel Gb may be disposed in a first diagonal direction extending from an upper-left position to a lower-right position. The red pixel R and the blue pixel B may be disposed in a second diagonal direction extending from an upper-right position to a lower-left position. The first diagonal direction and the second diagonal direction may intersect in an X-shape. In another embodiment, positions of the red pixel R and the blue pixel B may be interchanged. In another embodiment, positions of the first green pixel Gr and the second green pixel Gb may also be interchanged.

Figure 2C:
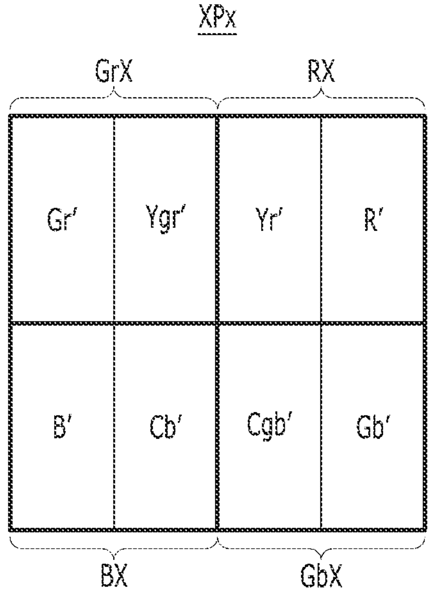
FIG. 2C is a diagram illustrating an arrangement of unit pixels (i.e., color filters) in the cross-talk sensing pixel group of the unit pixel block of the image sensing device according to an embodiment of the present disclosure.

FIG. 2C is a diagram illustrating an arrangement of unit pixels (i.e., color filters) Gr', Ygr', Yr', R', B', Cb', Cgb', and Gb' in the cross-talk sensing pixel group XPx of the unit pixel block 100 of the image sensing device 800 according to the embodiment of the present disclosure. Referring to FIG. 2C, the cross-talk sensing pixel group XPx of the unit pixel block 100 of the image sensing device 800 according to the embodiment of the present disclosure may include a first green sensing pixel (i.e., a first green sensing color filter) GrX, a red sensing pixel (i.e., a red sensing color filter) RX, a blue sensing pixel (i.e., a blue sensing color filter) BX, and a second green sensing pixel (i.e., a second green sensing color filter) GbX arranged in a matrix form having two rows and two columns. The first green sensing pixel GrX and the red sensing pixel RX may be adjacent to each other in the row direction. The blue sensing pixel BX and the second green sensing pixel GbX may be adjacent to each other in the row direction. The first green sensing pixel GrX and the blue sensing pixel BX may be adjacent to each other in the column direction. The red sensing pixel RX and the second green sensing pixel GbX may be adjacent to each other in the column direction. The first green sensing pixel GrX and the second green sensing pixel GbX may be disposed in the first diagonal direction extending from the upper-left position to the lower-right position. The red sensing pixel RX and the blue sensing pixel BX may be disposed in the second diagonal direction extending from the upper-right position to the lower-left position. In another embodiment, positions of the red sensing pixel RX and the blue sensing pixel BX may be interchanged. In another embodiment, positions of the first green sensing pixel GrX and the second green sensing pixel GbX may also be interchanged.

The first green sensing pixel GrX may have a combination of a first half green sensing pixel (i.e., a first half green sensing color filter) Gr' and a first half yellow sensing pixel (i.e., a first half yellow sensing color filter) Ygr'. The red sensing pixel RX may have a combination of a second half yellow sensing pixel (i.e., a second half yellow sensing color filter) Yr' and a half red sensing pixel (i.e., a half red sensing color filter) R'. The blue sensing pixel BX may have a combination of a half blue sensing pixel (i.e., a half blue sensing color filter) B' and a first half cyan sensing pixel (i.e., a first half cyan sensing color filter) Cb'. The second green sensing pixel GbX may have a combination of a second half cyan sensing pixel (i.e., a second half cyan sensing color filter) Cgb' and a second half green sensing pixel (i.e., a second half green sensing color filter) Gb'. The first half green sensing pixel Gr', the half red sensing pixel R', the half blue sensing pixel B', and the second half green sensing pixel Gb' may have the same arrangement as the pixel arrangement of the imaging pixel groups IPx1-IPx3. For example, the first half green sensing pixel Gr' may be disposed at the upper-left position, the half red sensing pixel R' may be disposed at the upper-right position, the half blue sensing pixel B' may be disposed at the lower-left position, and the second half green sensing pixel Gb' may be disposed at the lower-right position.

The first half yellow sensing pixel Ygr' and the second half yellow sensing pixel Yr' may be adjacently disposed between the first half green sensing pixel Gr' and the half red sensing pixel R'. The first half green sensing pixel Gr' and the first half yellow sensing pixel Ygr' may be disposed adjacent to each other in the row direction. The second half yellow sensing pixel Yr' and the half red sensing pixel R' may be disposed adjacent to each other in the row direction. For example, the first and second half yellow sensing pixels Ygr' and Yr' to sense a cross-talk of a green color and a red color may be disposed between the first half green sensing pixel Gr' and the half red pixel R'.

The first half cyan sensing pixel Cb' and the second half cyan sensing pixel Cgb' may be adjacently disposed between the half blue sensing pixel B' and the second half green sensing pixel Gb'. The half blue sensing pixel B' and the first half cyan sensing pixel Cb' may be disposed adjacent to each other in the row direction. The second half cyan sensing pixel Cgb' and the second half green sensing pixel Gb' may be disposed adjacent to each other in the row direction. For example, the first and second cyan sensing pixels Cb' and Cgb' to sense a cross-talk of a blue color and a green color may be disposed between the half blue sensing pixel B' and the second half green sensing pixel Gb'.

The first half green sensing pixel Gr' and the half blue sensing pixel B', the first half yellow sensing pixel Ygr' and the first half cyan sensing pixel Cb', the second half yellow sensing pixel Yr' and the second half cyan sensing pixel Cgb', and the half red sensing pixel R' and the second half green sensing pixel Gb' may be disposed to be adjacent to each other in the column direction, respectively.

The first green sensing pixel GrX of the cross-talk sensing pixel group XPx may have substantially the same area as the first green pixel Gr of the imaging pixel groups IPx1-IPx3. The red sensing pixel RX of the cross-talk sensing pixel group XPx may have substantially the same area as the red pixel R of the imaging pixel groups IPx1-IPx3. The blue sensing pixel BX of the cross-talk sensing pixel group XPx may have substantially the same area as the blue pixel B of the imaging pixel groups IPx1-IPx3. The second green sensing pixel GbX of the cross-talk sensing pixel group XPx may have substantially the same area as the second green pixel Gb of the imaging pixel groups IPx1-IPx3. However, since a boundary region may exist between the half pixels Gr', Ygr', Yr', R', B', Cb', Cgb', and Gb', each of the areas of the unit pixels GrX, RX, BX, and GbX of the cross-talk sensing pixel groups XPx may be smaller than each of the areas of the unit pixels Gr, R, B, and Gb of the imaging pixel groups IPx1-IPx3. That is, each of the areas of the half pixels Gr', Ygr', Yr', R', B', Cb', Cgb', and Gb' may be smaller than ½ of each of the areas of the unit pixels Gr, R, B, and Gb of the imaging pixel groups IPx1-IPx3.

Figure 3A:
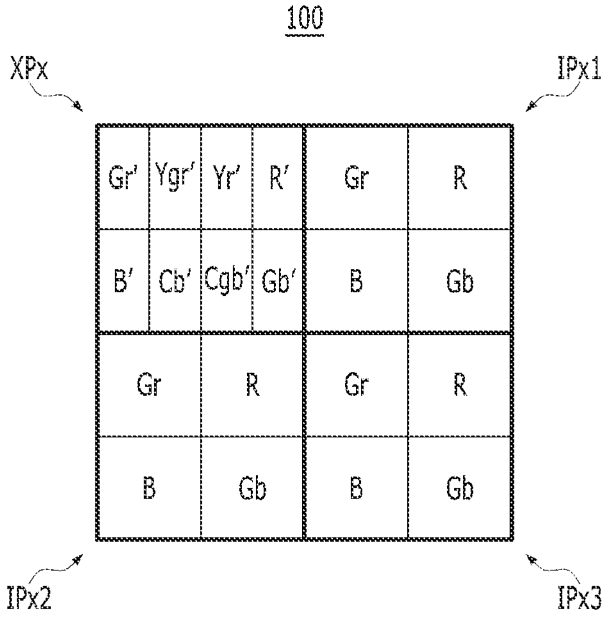
FIGS. 3A to 3D are diagrams illustrating arrangements of unit pixels or color filters of unit pixel blocks of an image sensing device according to embodiments of the present disclosure.
Figure 3B:
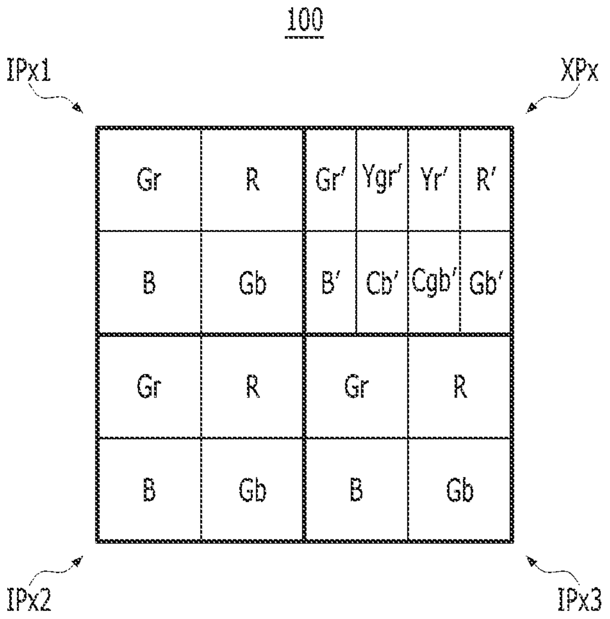
Figure 3C:
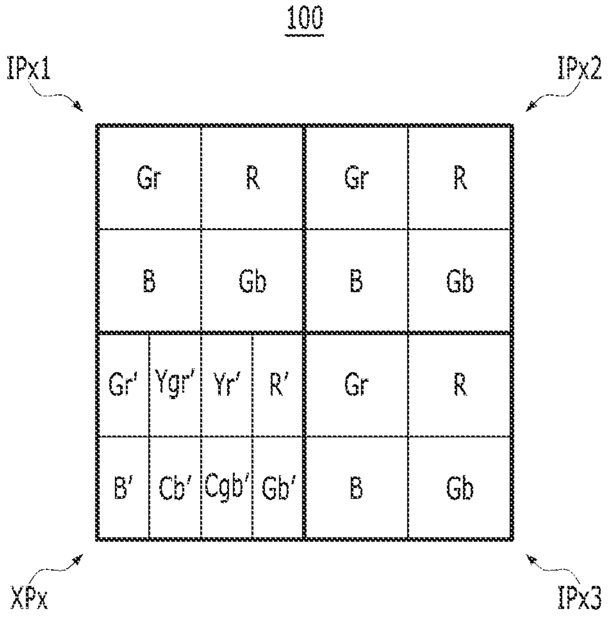
Figure 3D:
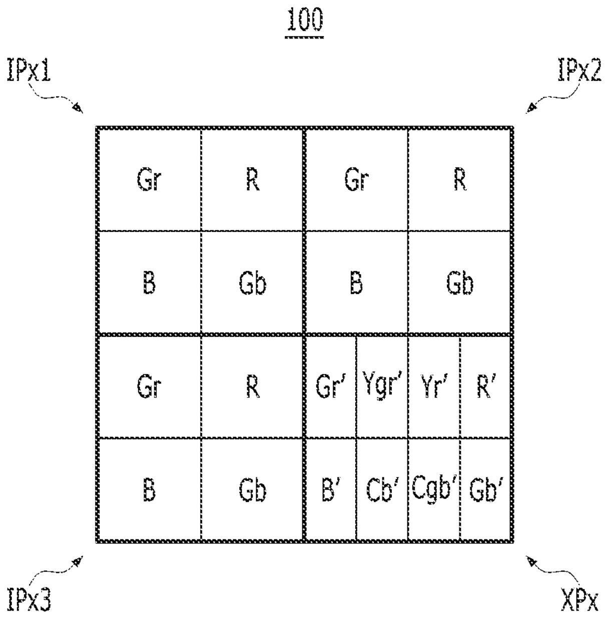

FIGS. 3A to 3D are diagrams illustrating arrangements of unit pixels or color filters of unit pixel blocks 100 of an image sensing device 800 according to embodiments of the present disclosure. Referring to FIGS. 3A to 3D, the unit pixel block 100 may include four pixel groups IPx1-IPx3 and XPx arranged in a matrix form having two rows and two columns. The cross-talk sensing pixel group XPx may be disposed in various positions of the unit pixel block 100. Referring to FIG. 3A, the cross-talk sensing pixel group XPx may be disposed at an upper-left position of a first row and a first column of the unit pixel block 100. Referring to FIG. 3B, the cross-talk sensing pixel group XPx may be disposed at an upper-right position of the first row and a second column of the unit pixel block 100. Referring to FIG. 3C, the cross-talk sensing pixel group XPx may be disposed at a lower-left position of the second row and the first column of the unit pixel block 100. Referring to FIG. 3D, the cross-talk sensing pixel group XPx may be disposed at a lower-right position of the second row and the second column of the unit pixel block 100. The arrangements of the imaging pixel groups IPx1-IPx3 and the cross-talk sensing pixel group XPx shown in FIGS. 2A to 2C may be the same as the pixel arrangement of the unit pixel block 100 shown in FIG. 3D.

Figure 4:
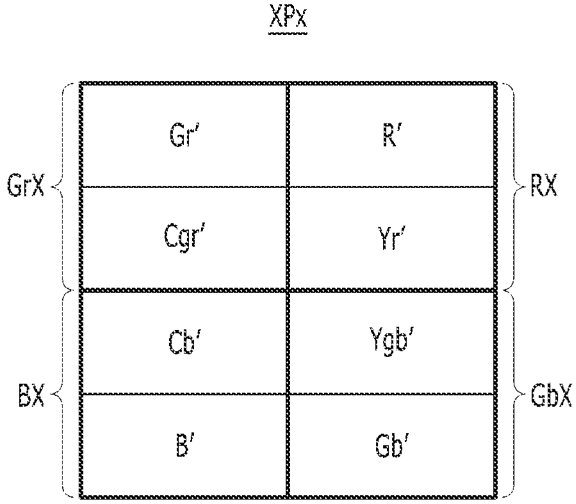
FIG. 4 is a diagram illustrating an arrangement of unit pixels (i.e., color filters) of a cross-talk sensing pixel group of the unit pixel block of the image sensing device according to another embodiment of the present disclosure.

FIG. 4 is a diagram illustrating an arrangement of unit pixels (i.e., color filters) of a cross-talk sensing pixel group XPx of the unit pixel block 100 of the image sensing device 800 according to another embodiment of the present disclosure. Referring to FIG. 4, a cross-talk sensing pixel group XPx of the unit pixel block 100 of the image sensing device 800 according to another embodiment of the present disclosure may include a first half cyan sensing pixel Cgr' and a second half cyan sensing pixel Cb' between a first half green sensing pixel Gr' and a half blue sensing pixel B', and a first half yellow sensing pixel Yr' and a second half yellow sensing pixel Ygb' between a half red sensing pixel R' and a second half green sensing pixel Gb'.

The first green sensing pixel GrX may include a combination of the half green sensing pixel Gr' and the first half cyan sensing pixel Cgr', the red sensing pixel RX may include a combination of the half red sensing pixel R' and the first half yellow sensing pixel Yr', the blue sensing pixel BX may include a combination of the second half cyan sensing pixel Cb' and a half blue sensing pixel B', and the second green sensing pixel GbX may include a combination of the second half yellow sensing pixel Ygb' and the second half green sensing pixel Gb'.

The half yellow sensing pixels Yr' and Ygb' to sense a cross-talk between the green color and the red color may be disposed between the half red sensing pixel R' and the second half green sensing pixel Gb' to be aligned in the column direction, the half cyan sensing pixels Cgr' and Cb' for sensing a cross-talk between the green color and the blue color may be disposed between the first half green sensing pixel Gr' and the half blue sensing pixel B' to be aligned in the column direction.

Figure 5A:
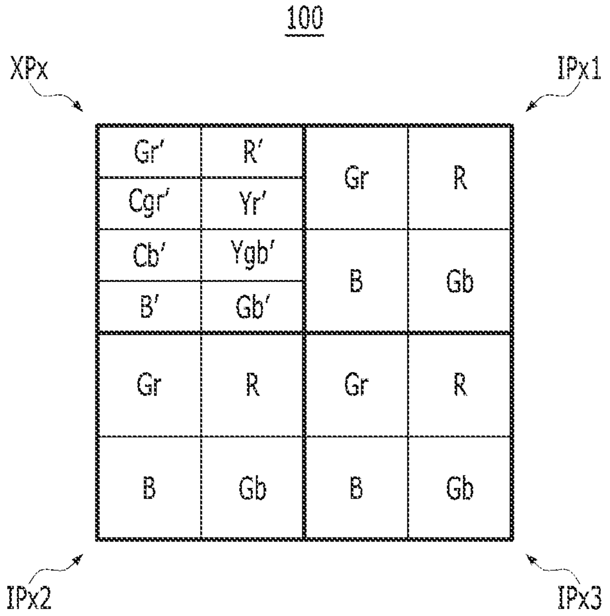
FIGS. 5A to 5D are diagrams illustrating arrangements of unit pixels (i.e., color filters) of unit pixel blocks of the image sensing device according to embodiments of the present disclosure.
Figure 5B:
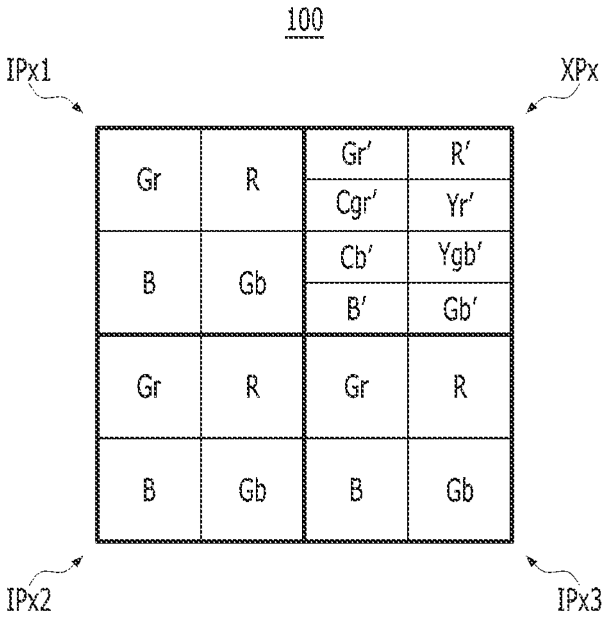
Figure 5C:
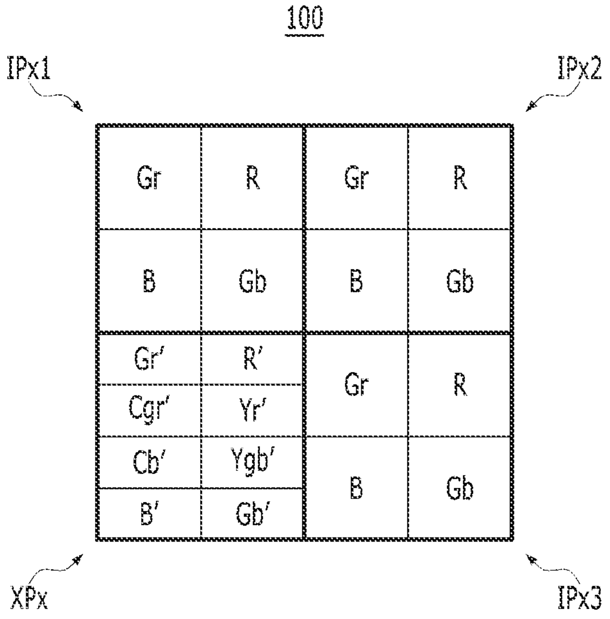
Figure 5D:
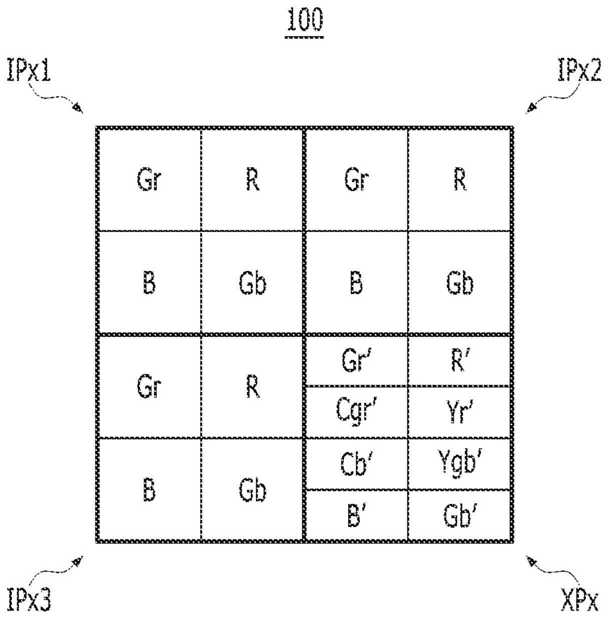

FIGS. 5A to 5D are diagrams illustrating arrangements of unit pixels (i.e., color filters) of unit pixel blocks 100 of the image sensing device 800 according to embodiments of the present disclosure. Referring to FIGS. 5A to 5D, the unit pixel block 100 may include four pixels IPx1-IPx3 and XPx arranged in a matrix form having two rows and two columns. The cross-talk sensing pixel group XPx may be disposed at various positions of the unit pixel block 100. The cross-talk sensing pixel group XPx may have the pixel arrangement shown in FIG. 4. Referring to FIG. 5A, the cross-talk sensing pixel group XPx may be disposed at the upper-left position of the first row and the first column of the unit pixel block 100. Referring to FIG. 5B, the cross-talk sensing pixel group XPx may be disposed at the upper-right position of the first row and the second column of the unit pixel block 100. Referring to FIG. 5C, the cross-talk sensing pixel group XPx may be disposed at the lower-left position of the second row and first column of the unit pixel block 100. Referring to FIG. 5D, the cross-talk sensing pixel group XPx may be disposed at the lower-right position of the second row and the second column of the unit pixel block 100.

In another view point, further referring again to FIGS. 2C and 4, the cross-talk sensing pixel group XPx may include the half pixels Gr', Ygr', Yr', R', B', Cb', Cgb', and Gb' arranged in the matrix form having two rows and four columns or four rows and two columns.

Figure 6A:
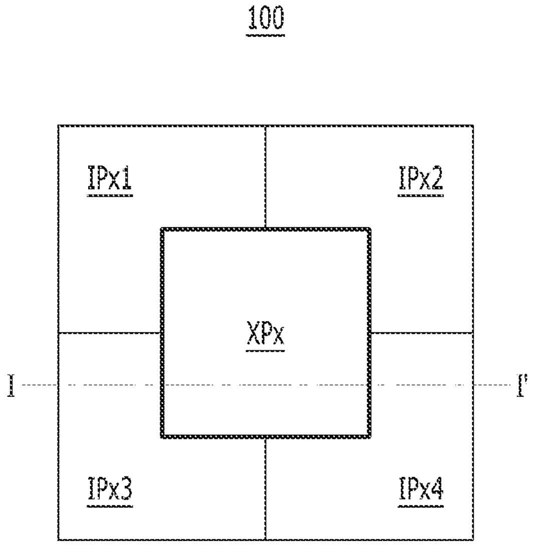
FIG. 6A is a diagram illustrating a pixel arrangement of the unit pixel block of the image sensing device according to an embodiment of the present disclosure.
Figure 6B:
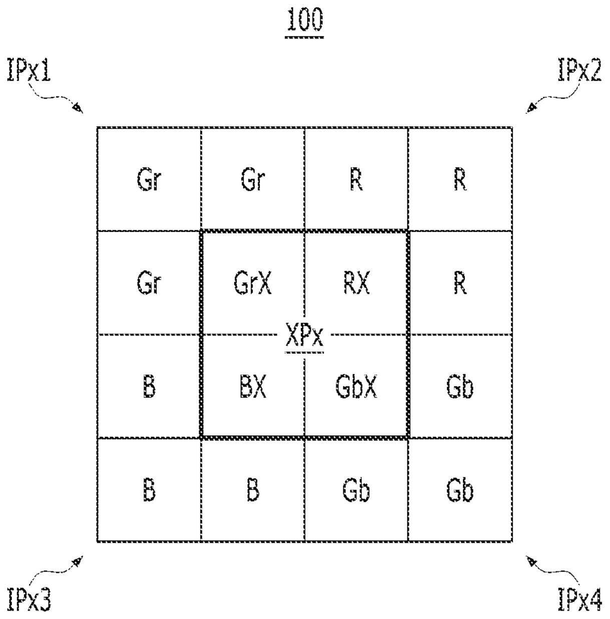
FIGS. 6B to 6D are diagrams illustrating pixel arrangements of the imaging pixel groups and the cross-talk sensing pixel group according to an embodiment of the present disclosure.
Figure 6C:
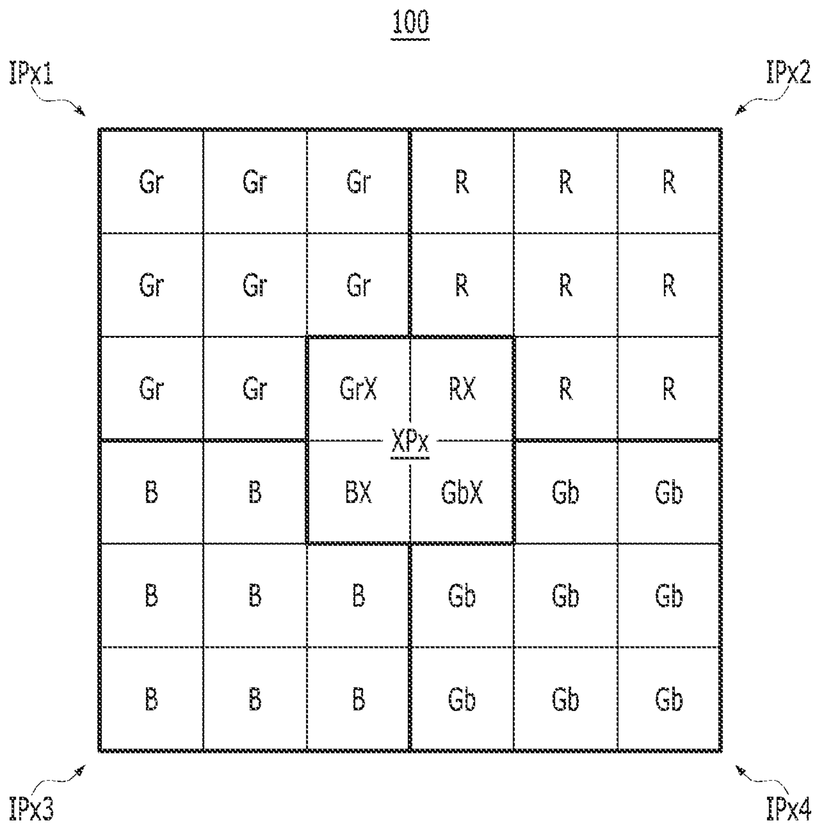
Figure 6D:
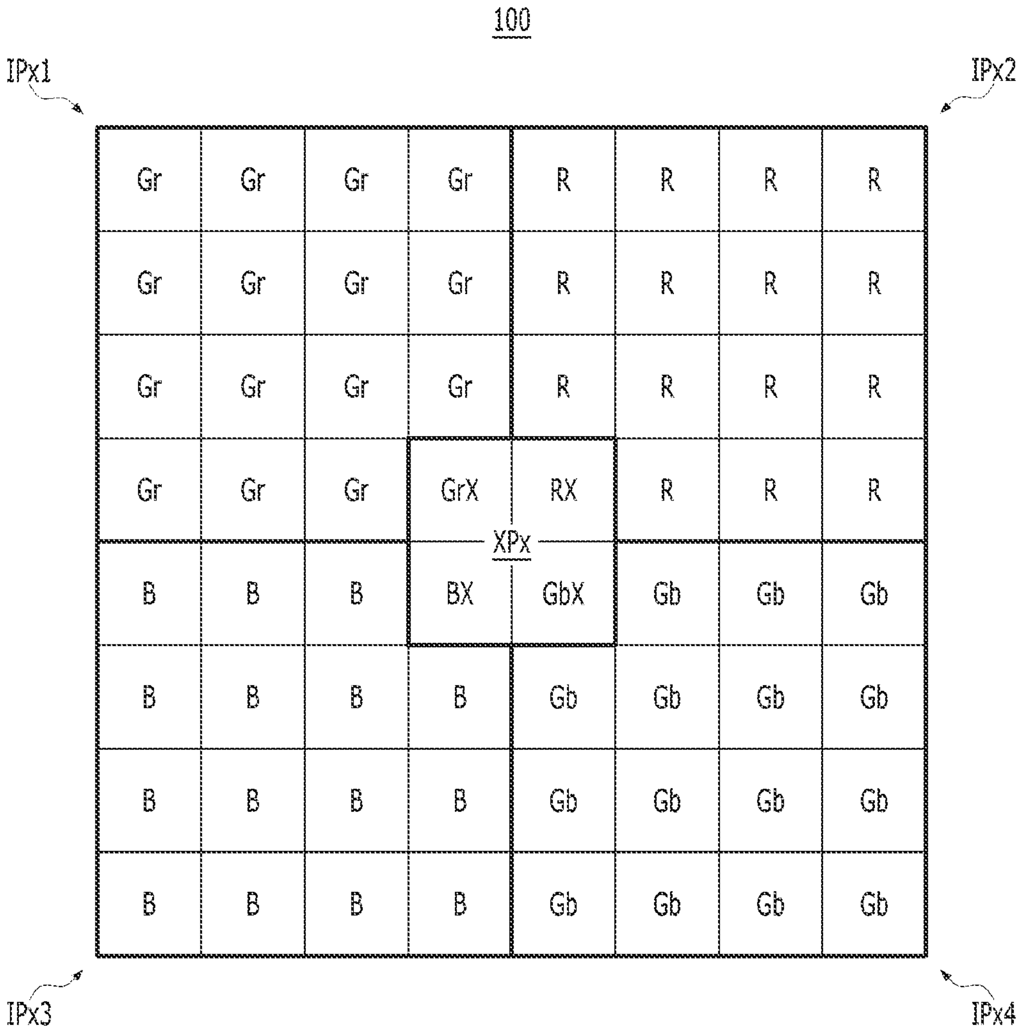

FIG. 6A is a diagram illustrating a pixel arrangement of the unit pixel block 100 of the image sensing device 800 according to an embodiment of the present disclosure, and FIGS. 6B to 6D are diagrams illustrating pixel arrangements of the imaging pixel groups IPx1-IPx4 and the cross-talk sensing pixel group XPx of the unit pixel block 100 of the image sensing device 800 shown in FIG. 6A. Referring to FIGS. 6A to 6D, unit pixel blocks 100 of the image sensing device 800 according to embodiments of the present disclosure may include first to fourth imaging pixel groups IPx1-IPx4 arranged in a matrix form having multiple rows and multiple columns, and a cross-talk sensing pixel group XPx disposed at a central position of the matrix form. For example, the first to fourth imaging pixel groups IPx1-IPx4 may be arranged in the matrix form having two rows and two columns, and the cross-talk sensing pixel XPx may be disposed at the central position of the unit pixel block 100 to be surrounded by the first to fourth imaging pixel groups IPx1-IPx4. The cross-talk sensing pixel XPx may occupy portions (each one unit pixel) of the first to fourth imaging pixel groups IPx1-IPx4. For example, the unit pixels Gr, R, B, and Gb each provided from the first to fourth imaging pixel groups IPx1-IPx4 may form the cross-talk sensing pixel group XPx. Specifically, the cross-talk sensing pixel group XPx may include one unit pixel GrX positioned at the lower-right position of the first image sensing group IPx1 positioned at the upper-left position of the unit pixel block 100, one unit pixel RX positioned at the lower-left position of the second imaging sensing pixel IPx2 positioned at the upper-right position of the unit pixel 100, one unit pixel BX positioned at the upper-right position of the third imaging sensing pixel IPx3 positioned at the lower-left position of the unit pixel 100, and one unit pixel GbX positioned at the upper-right position of the fourth image sensing group IPx4 positioned at the lower-right position of the unit pixel block 100.

Referring to FIGS. 6B to 6D, the imaging pixel groups IPx1-IPx4 of the unit pixel block 100 may include unit pixels Gr, R, B, and Gb each having the same color. Specifically, the first imaging pixel group IPx1 may include first green pixels Gr arranged in a matrix form having M rows and N columns, and the second imaging pixel group IPx2 may include red pixels R arranged in a matrix form having M rows and N columns, the third imaging pixel group IPx3 may include blue pixels B arranged in a matrix form having M rows and N columns, and the fourth imaging pixel group IPx4 may include second green pixels Gb arranged in a matrix form having M rows and N columns. The M and N are natural numbers greater than or equal to 2. The first to fourth imaging pixel groups IPx1-IPx4 having the unit pixels Gr, R, B, Gb arranged in the matrix form each having two rows and two columns are shown in FIG. 6B, the first to fourth imaging pixel groups IPx1-IPx4 having the unit pixels Gr, R, B, Gb arranged in a matrix form each having three rows and three columns are shown in FIG. 6C, and the first to fourth imaging pixel groups IPx1-IPx4 having the unit pixels Gr, R, B, Gb arranged in a matrix form each having four rows and four columns are shown in FIG. 6D.

Since the M and N may be equal to or greater than five, in other embodiments, the first to fourth imaging pixel groups IPx1-IPx4 may include unit pixels Gr, R, B, Gb arranged in matrix forms each having equal to or greater than five rows and equal to or greater than five columns.

As describe above, the imaging pixel groups IPx1-IPx4 may each provide one of the four unit pixels Gr, R, B, Gb to form the cross-talk sensing pixel group XPx. That is, the cross-talk sensing pixel group XPx may include four unit cross-talk sensing pixels GrX, RX, BX, and GbX provided from each imaging pixel group IPx1-IPx4. The cross-talk sensing pixel group XPx may have the pixel arrangement shown in FIG. 2C or FIG. 4.

Figure 7A:
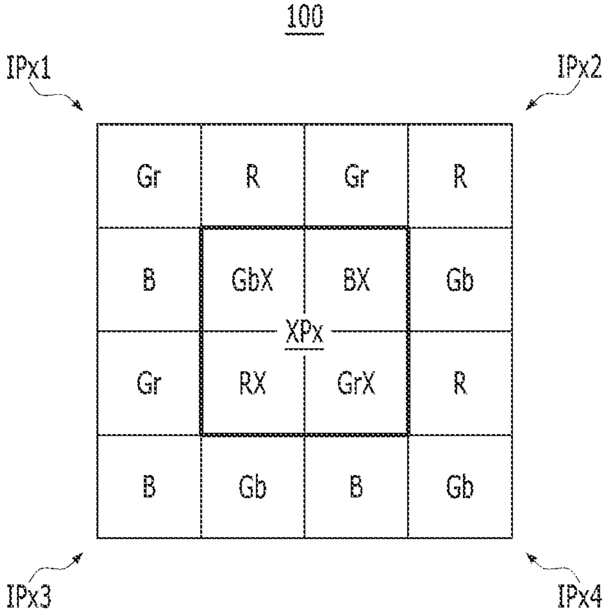
FIG. 7A is a diagram illustrating an arrangement of pixel groups of the unit pixel block of the imaging sensing device according to an embodiment of the present disclosure.
Figure 7B:
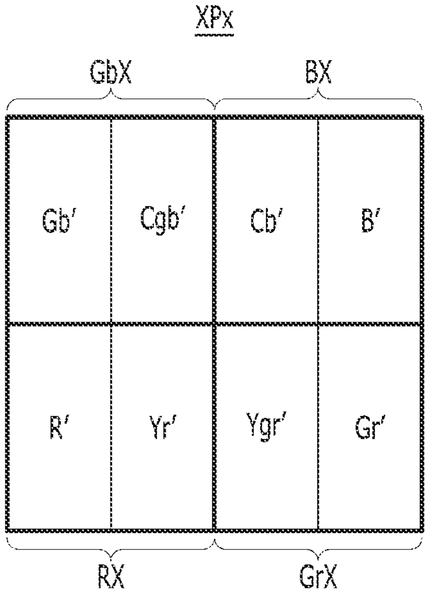
FIGS. 7B to 7E are diagrams illustrating arrangements of unit pixels (i.e., color filters) of the imaging pixel group and the cross-talk sensing pixel group according to an embodiment of the present disclosure.
Figure 7C:
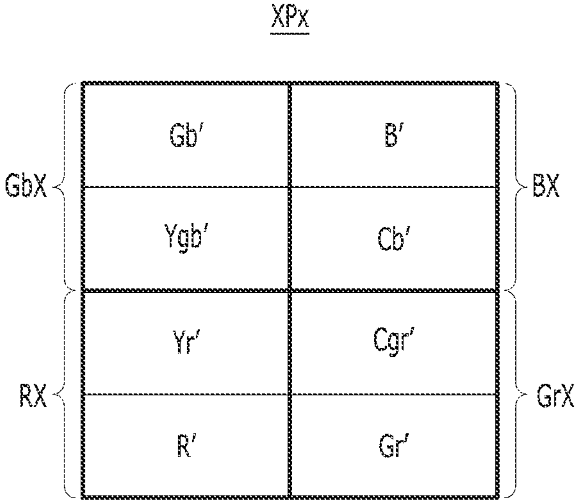

FIG. 7A is a diagram illustrating an arrangement of pixel groups of the unit pixel block 100 of the imaging sensing device 800 according to an embodiment of the present disclosure, and FIGS. 7B to 7E are diagrams illustrating arrangements of unit pixels (i.e., color filters) of the imaging pixel group IPx1-IPx4 and the cross-talk sensing pixel group XPx of the unit pixel block 100 shown in FIG. 7A. Referring to FIGS. 7A to 7C, the unit pixel block 100 of the image sensing device 800 according to an embodiment of the present disclosure may include first to fourth imaging pixel groups IPx1-IPx4 arranged in a matrix form having two rows and two columns and a cross-talk sensing pixel group XPx arranged at a central position of the matrix form.

The cross-talk sensing pixel XPx may occupy portions (each one unit pixel) of the first to fourth imaging pixel groups IPx1-IPx4. As described with reference to FIGS. 6A and 6B, the cross-talk sensing pixel group XPx may be formed of the unit pixels Gr, R, B, and Gb each provided from the first to fourth imaging pixel groups IPx1-IPx4. For example, the cross-talk sensing pixel group XPx may include a second green sensing pixel GbX, a blue sensing pixel BX, a red sensing pixel RX and a first green sensing pixel GrX arranged in a matrix form having two rows and two columns. For example, the cross-talk sensing pixel group XPx may include a second green sensing pixel GbX disposed at the lower-right position of the first imaging pixel group IPx1 disposed at the upper-left position (first row and first column) of the unit pixel block 100, the blue sensing pixel BX disposed at the lower-left position of the second imaging pixel group IPx2 disposed at the upper-right position (first row and second column) of the unit pixel block 100, the red sensing pixel RX arranged at the upper-right position of the third imaging pixel group IPx3 disposed at the lower-left position (second row and first column), and the first green sensing pixel GrX disposed at the upper-left position of the fourth imaging pixel group IPx4 disposed at the lower-right position (second row and second column).

Referring to FIG. 7B, the second green sensing pixel GbX may include a combination of the second half green sensing pixel Gb' and the second half cyan sensing pixel Cgb' adjacent in the row direction, the blue sensing pixel BX may include a combination of the first half cyan sensing pixel Cb' and the half blue sensing pixel B' adjacent in the row direction, the red sensing pixel RX may include a combination of the half red sensing pixel R' and the second half yellow sensing pixel Yr' adjacent in the row direction, and the first green sensing pixel GrX may include a combination of the first half yellow sensing pixel Ygr' and the first half green sensing pixel Gr' adjacent in the row direction. The half cyan sensing pixels Cgb' and Cb' adjacent in the row direction may be disposed between the second half green sensing pixel Gb' and the half blue sensing pixel B', and the half yellow sensing pixels Yr' and Ygr' adjacent in the row direction may be disposed between the half red sensing pixel R' and the first half green sensing pixel Gr'.

Referring to FIG. 7C, the second green sensing pixel GbX may include a combination of the second half green sensing pixel Gb' and the second half yellow sensing pixel Ygb' adjacent in the column direction, the blue sensing pixel BX may include a combination of the half blue sensing pixel B' and the first half cyan sensing pixel Cb' adjacent in the column direction, the red sensing pixel RX may include a combination of the second half yellow sensing pixel Yr' and the half red sensing pixel R' adjacent in the column direction, the first green sensing pixel GrX may include a combination of the second half cyan sensing pixel Cgb' and the first half green sensing pixel Gr' adjacent in the column direction. The half yellow sensing pixels Ygb' and Yr' adjacent in the column direction may be disposed between the second half green sensing pixel Gb' and the half red sensing pixel R', and the half cyan sensing pixels Cb' and Cgr' adjacent in the column direction may be disposed between the half blue sensing pixel B' and the first half green sensing pixel Gr'.

Figure 7D:
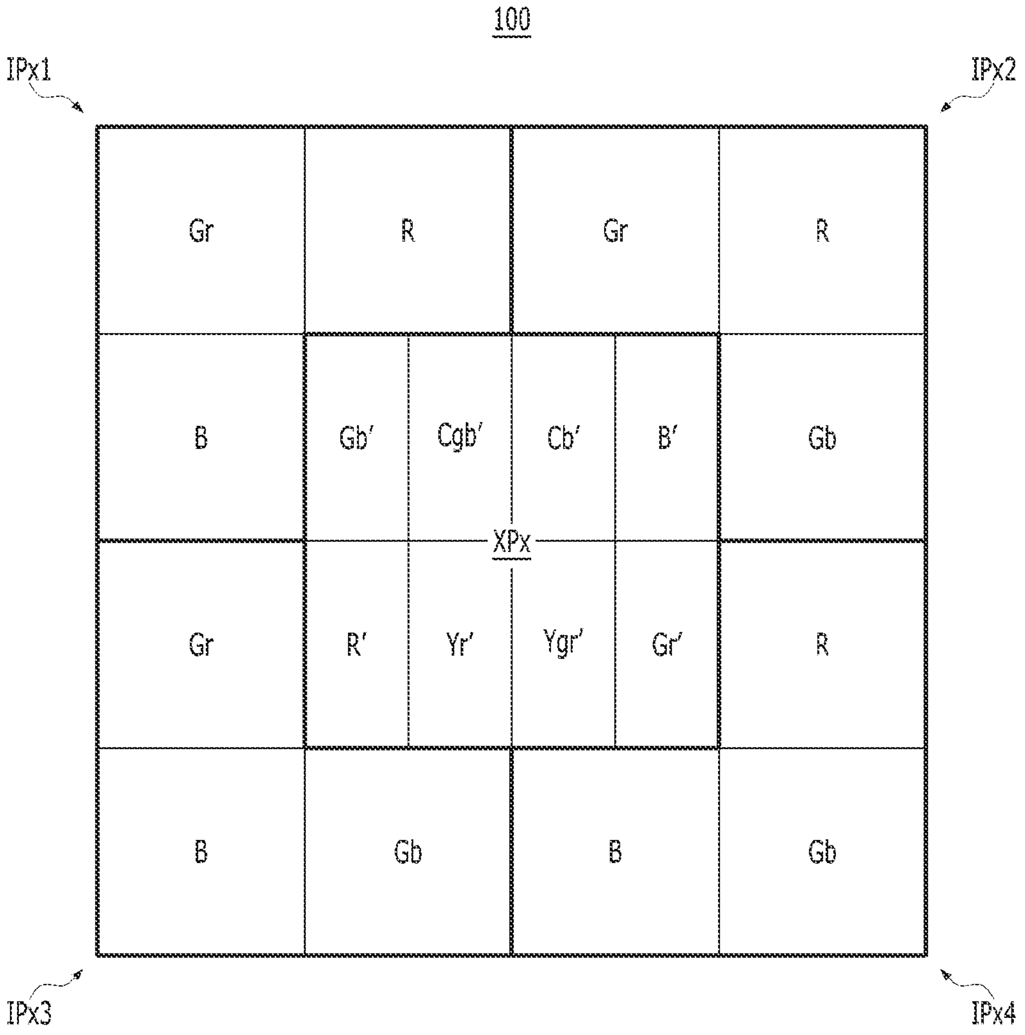
Figure 7E:
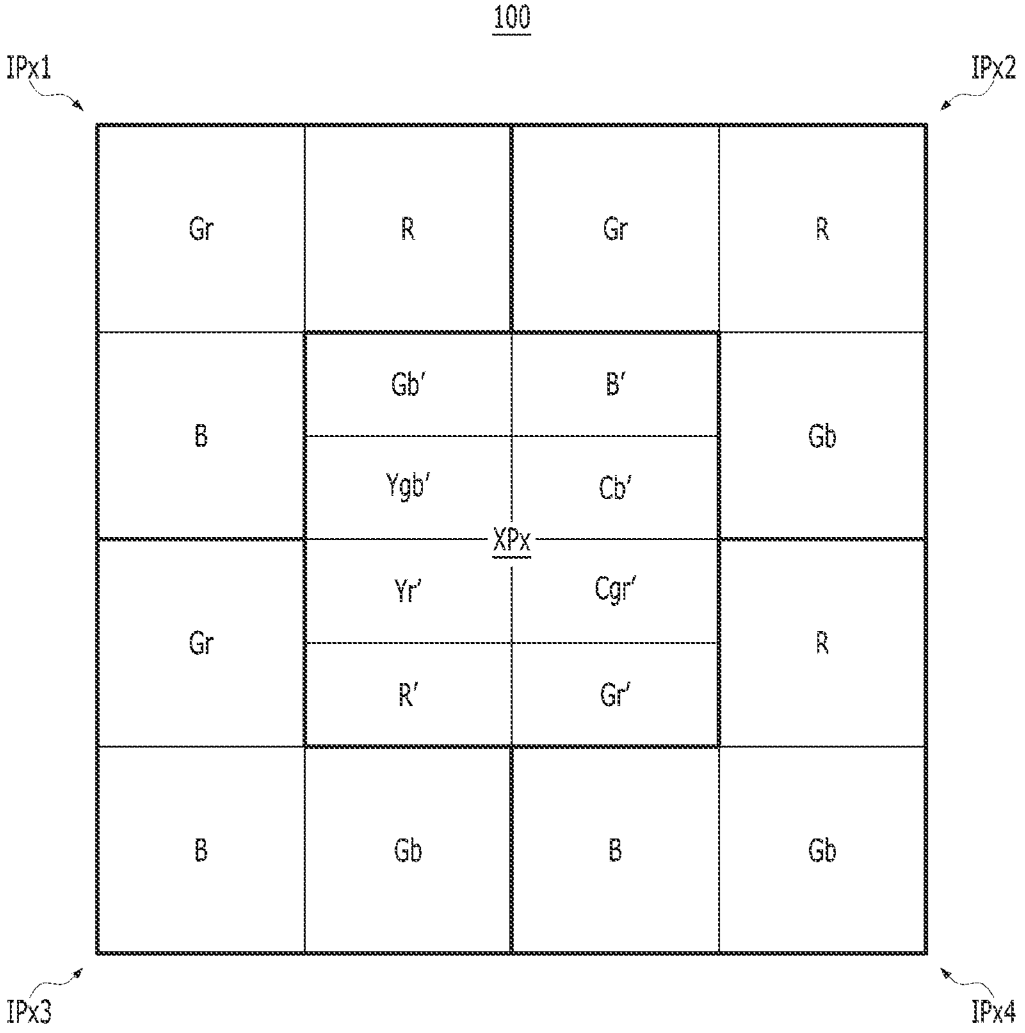

FIG. 7D is a diagram combining FIGS. 7A and 7B. The pixel arrangement of the imaging pixel groups IPx1-IPx4 and the cross-talk sensing pixel group XPx respectively shown in FIGS. 7A and 7B, for example, a color filter arrangement, is illustrated to easily understand the technical concept of the present embodiment. FIG. 7E is a diagram combining FIGS. 7A and 7C. The pixel arrangement of the imaging pixel groups IPx1-IPx4 and the cross-talk sensing pixel group XPx respectively shown in FIGS. 7A and 7C, for example, a color filter arrangement, is illustrated to easily understand the technical concept of the present embodiment.

As described above, with reference to FIGS. 2A to 7E, the "pixel" may mean the "color filter".

Figure 8:
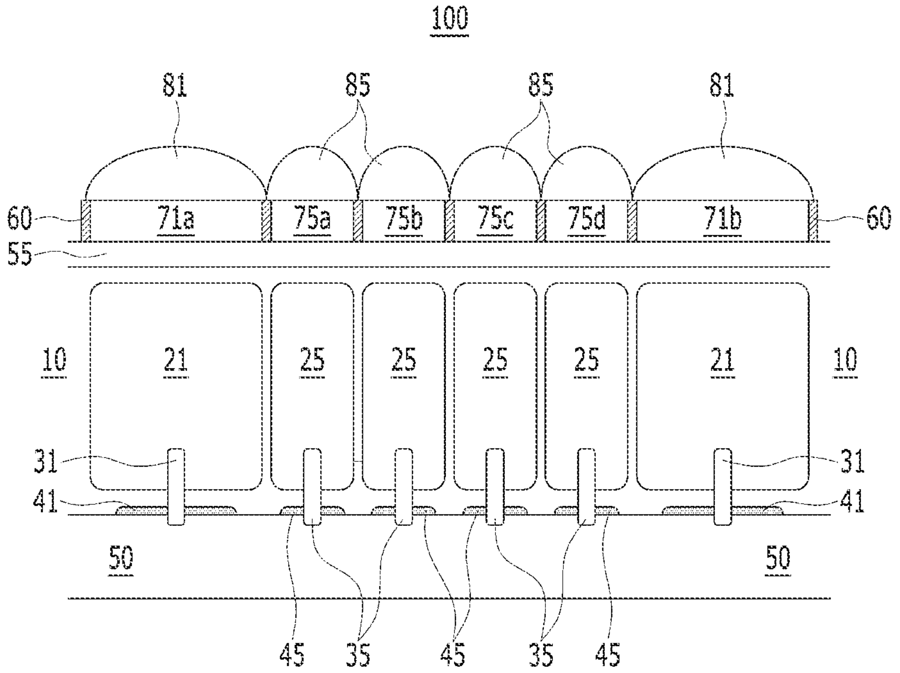
FIG. 8 is a longitudinal cross-sectional view of the unit pixel block taken along line I-I' of FIG. 6A according to an embodiment of the present disclosure.

FIG. 8 is a longitudinal cross-sectional view of the unit pixel block 100 taken along line I-I' of FIG. 6A. Referring to FIG. 8, the unit pixel block 100 according to an embodiment of the present disclosure may include photodiodes 21 and 25 formed in a substrate 10, transfer gates 31 and 35, floating diffusion regions 41 and 45, a circuit layer 50, a planarization layer 55, a pixel grid pattern 60, color filters 71*a* and 71*b* and 75*a*-75*d*, and micro lenses 81 and 85.

The substrate 10 may include a semiconducting layer, for example, a silicon wafer or a single crystal silicon epitaxially grown layer.

The photodiodes 21 and 25 may be formed by doping ions into the substrate 10. The ions may include boron (B), phosphorus (P), arsenic (As), or other dopants of Group 13 and 15. The photodiodes 21, 25 may include an imaging photodiode 21 and cross-talk sensing photodiodes 25. The imaging photodiodes 21 may sense the first green color Gr, the red color R, the blue color B, and the second green color Gb. The cross-talk sensing photodiodes 25 may sense the first green color Gr', the red color R', the blue color B', the second green color Gb', the yellow color Ygr' and Yr', and the cyan colors Cb' and Cgb'. A size of each of the cross-talk sensing photodiodes 25 may be smaller than a size of each of the imaging photodiodes 21. A horizontal width of each of the cross-talk sensing photodiodes 25 may be less than or equal to half of a horizontal width of each of the imaging photodiodes 21. In a longitudinal cross-sectional view rotated by 90°, the horizontal width of the imaging photodiodes 21 and the horizontal width of the cross-talk sensing photodiodes 25 may be substantially the same. For example, a volume of each of the cross-talk sensing photodiodes 25 may be less than half of a volume of each of the imaging photodiodes 21. Two cross-talk sensing photodiodes 25 can each occupy the volume of one imaging photodiode 21 divided by two. Each of the cross-talk sensing photodiodes 25 may be electrically insulated from each other.

Each of the transfer gates 31 and 35 may be formed on a bottom surface of the substrate 10. For example, each of the transfer gates 31 and 35 may have a vertical gate electrode extending from the bottom surface of the substrate 10 to the inside of the substrate 10. The transfer gates 31 and 35 may include imaging transfer gates 31 and cross-talk sensing transfer gates 35. The transfer gates 31 and 35 may transfer photo-charges in the photodiodes 21 and 25 to the floating diffusion regions 41 and 45.

The floating diffusion regions 41 and 45 may be formed in the substrate 10 to abut the bottom surface of the substrate 10. The floating diffusion regions 41 and 45 may be formed by doping ions such as phosphorus (P) or arsenic (As) into the substrate 10. The floating diffusion regions 41 and 45 may include imaging floating diffusion regions 41 and cross-talk sensing floating diffusion regions 45. A volume of each of the cross-talk sensing floating diffusion regions 45 may be smaller than a volume of each of the imaging floating diffusion regions 41. The transfer gates 31 and 35 and the floating diffusion regions 41 and 45 may be arranged to correspond to one for each of the photodiodes 21 and 25.

The circuit layer 50 may include a plurality of metal interconnections connected to the transfer gates 31 and 35 and the floating diffusion regions 41 and 45 and insulating layers. In an embodiment, the circuit layer 50 may further include a bonded silicon wafer. For example, the circuit layer 50 may further include another silicon substrate and logic transistors.

The planarization layer 50 may be formed on a top surface of the substrate 10. The planarization layer 50 may include an inorganic material having a flat surface. The planarization layer 50 may include an anti-reflection layer.

In a top view, the pixel grid pattern 60 may have a mesh shape. The pixel grid pattern 60 may be vertically aligned with borders of the photodiodes 21 and 25 and borders of the color filters 71*a* and 71*b* and 75*a*-75*d*. The pixel grid pattern 60 may include a metal such as tungsten (W).

The color filters 71*a* and 71*b* and 75*a*-75*d* may be disposed between the pixel grid patterns 60. The color filters 71*a* and 71*b* and 75*a*-75*d* may include imaging color filters 71*a* and 71*b* and cross-talk sensing color filters 75*a*-75*d*. Each of the imaging color filters 71*a* and 71*b* may selectively include one of the first green color filter Gr, the red color filter R, the blue color filter B, and the second green color filter Gb. Each of the cross-talk sensing color filters 75*a*-75*d* may include one of a first green sensing color filter Gr', a red sensing color filter R', a blue sensing color filter B', a second green sensing color filter Gb', yellow sensing color filters Ygr' and Yr', and cyan sensing color filters Cb' and Cgb'. More specifically, the first and fourth cross-talk sensing color filters 75*a* and 75*d* adjacent to the first and second imaging color filters 71*a* and 71*b* may include the same colors as the first and second imaging color filters 71*a* and 71*b*, and the second and third cross-talk sensing color filters 75*b* and 75*c* disposed between the first and fourth cross-talk sensing color filters 75*a* and 75*d* may include mixed colors of the first and fourth cross-talk sensing color filters 75*a* and 75*d*. For example, when the first imaging color filter 71*a* is the first green color and the second imaging color filter 71*b* is the red color, the first cross-talk sensing color filter 75*a* adjacent to the first imaging color filter 71*a* may be the first green color as same as the first imaging color filter 71*a*, the fourth cross-talk sensing color 75*d* adjacent to the second imaging color filter 71*b* may be the red color as same as the second imaging color filter 71*b*, and the second and third cross-talk sensing color filters 75*b* and 75*c* may be the yellow colors. In addition, when the first imaging color filter 71*a* is the blue color and the second imaging color filter 71*b* is the second green color, the first cross-talk sensing color filter 75*a* adjacent to the first imaging color filter 71*a* may be the blue color B as same as the first imaging color filter 71*a*, the fourth cross-talk sensing color filter 75*d* adjacent to the second imaging color filter 71*b* may be the second green color which is the same as the second imaging color filter 71*b*, and the second and third cross-talk sensing color filters 75*b*-75*c* may be the cyan colors. A horizontal width of the cross-talk sensing color filters 75*a*-75*d* may be less than or equal to ½ of a horizontal width of the imaging color filters 71*a* and 71*b*. In the longitudinal cross-sectional view rotated by 90°, the horizontal widths of the imaging color filters 71*a* and 71*b* and the horizontal width of the cross-talk sensing color filters 75*a*-75*d* may be the same. That is, two opposite sides of the cross-talk sensing color filters 75*a*-75*d* may be half of a first width of the imaging color filters 71*a* and 71*b*, and the other two opposite sides of the cross-talk sensing color filters 75*a*-75*d* may be equal to a second width of the imaging color filters 71*a* and 71*b*.

The micro lenses 81 and 85 may include imaging micro lenses 81 and cross-talk sensing micro lenses 85. A diameter of each of the cross-talk sensing micro lenses 85 may be less than or equal to half of a diameter of each of the imaging micro lenses 81. In the longitudinal cross-sectional view rotated by 90°, the horizontal widths of the imaging micro lenses 81 and the horizontal widths of the cross-talk sensing micro lenses 85 may be the same. A volume of each of the cross-talk sensing micro lenses 85 may be smaller than a volume of each of the imaging micro lenses 81.

Each of the imaging micro lenses 81, each of the imaging color filters 71*a* and 71*b*, each of the imaging photodiodes 21, each of the imaging transfer gates 31, and each of the imaging floating diffusion regions 41 may be vertically aligned. Each of the cross-talk sensing micro lenses 85, each of the cross-sensing color filters 75*a*-75*d*, each of the cross-talk sensing photodiodes 25, each of the cross-talk sensing transfer gates 35, and each of the cross-talk sensing floating diffusion regions 45 may be vertically aligned.

Figure 9:
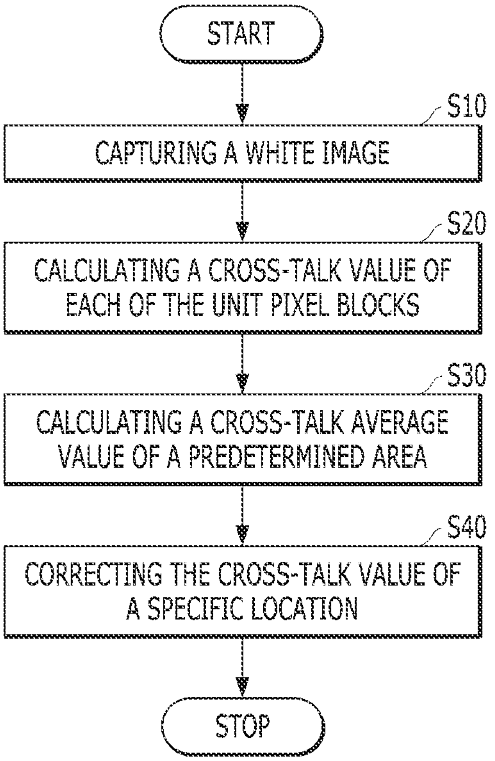
FIG. 9 is a flowchart illustrating a method of correcting cross-talk of a captured image in an image sensing device according to an embodiment of the present disclosure.

FIG. 9 is a flowchart illustrating a method of correcting cross-talk of a captured image in an image sensing device 800 according to an embodiment of the present disclosure. Referring to FIG. 9, a method of correcting a cross-talk value of an image sensing device 800 according to an embodiment of the present disclosure may include capturing a white image (S10). In one embodiment, the captured white image may be adjusted to have a color temperature of about 5100K.

Next, the method may further include calculating a cross-talk value of each of the unit pixel blocks 100 (S20).

Next, the method may further include calculating a cross-talk average value of a predetermined area (S30). The predetermined area may include a plurality of unit pixel blocks 100. A size of the predetermined region may be set according to various criteria.

Next, the method may further include correcting the cross-talk value of a specific location (S40). The predetermined area, the unit pixel block 100, the unit pixel groups IPx1-IPx4, XPx of the unit pixel block 100, or unit pixels Gr, R, B, and Gb may be located at the specific location. Accordingly, the cross-talk value of the predetermined area, unit pixel blocks 100, the unit pixel groups IPx1-IPx4, XPx of the unit pixel block 100, or the unit pixels Gr, R, B, and Gb can be corrected according to user's intention and criteria.

In an intermediate stage or pre-stage, the half yellow pixels Ygr' and Yr' and the half cyan pixels Cgb' and Cb' of the cross-talk sensing pixel XPx may be incorporated to the surrounding half pixels Gr', B', R', and Gb' and can be calculated and converted into a color value of one unit pixel Gr, R, B, and Gb, respectively. For example, a color value of the first half green sensing pixel Gr' and a color value of the first half yellow sensing pixel Ygb' may be calculated and converted into a color value of the green pixel Gr, a color value of the second half yellow sensing pixel Yr' and a color value of the half red sensing pixel R' may be calculated and converted into a color value of the red pixel R, a color value of the half blue sensing pixel B' and a color value of the first half cyan pixel Cb' may be calculated and converted into a color value of the blue pixel B, and a color value of the second half cyan pixel Cgb' and a color value of the second half green pixel Gb' may be calculated and converted into the second green pixel Gb.

Figure 10A:
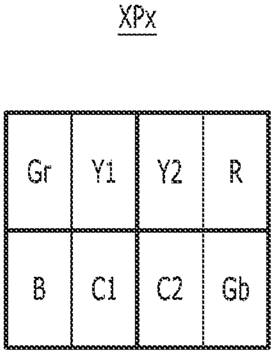
FIG. 10A to 10D are diagrams for describing a method of correcting cross-talk of unit pixel blocks arranged in a pixel array 810 of an image sensing device according to an embodiment of the present disclosure.

FIG. 10A to 10D are diagrams for describing a method of correcting cross-talk of unit pixel blocks 100 arranged in a pixel array 810 of an image sensing device 800 according to an embodiment of the present disclosure. FIG. 10A is a diagram illustrating the cross-talk sensing pixel group XPx of the unit pixel block 100. Referring to FIG. 10A, the cross-talk value of one unit pixel block 100 may be calculated as follows based on the light intensity sensed by the cross-talk sensing pixel group XPx.

$$RG_{x-talk}=(Y1+Y2)-\alpha_1(R+G_r) \quad \text{Equation 1}$$

$$BG_{x-talk}=(C1+C2)-\alpha_2(B+G_b) \quad \text{Equation 2}$$

$RG_{x\text{-}talk}$: Cross-talk value between the red color R and the first green color Gr.

$BG_{x\text{-}talk}$: Cross-talk value between the blue color B and the second green color Gb.

Y1: Light intensity sensed in the Y1 pixel.

Y2: Light intensity sensed in the Y2 pixel.

R: Light intensity sensed in the R pixel.

Gr: Light intensity sensed in the Gr pixel.

C1: Light intensity sensed in the C1 pixel.

C2: Light intensity sensed in the C2 pixel.

B: Light intensity sensed in the B pixel.

Gb: Light intensity sensed in the Gb pixel.

$\alpha_1$, $\alpha_2$: Process factor (weight). Generally, it is 1, but it can be changed according to the pre-test results.

Values obtained by Equation 1 and Equation 2 may be set as the cross-talk value of the corresponding unit pixel block 100.

Figure 10B:
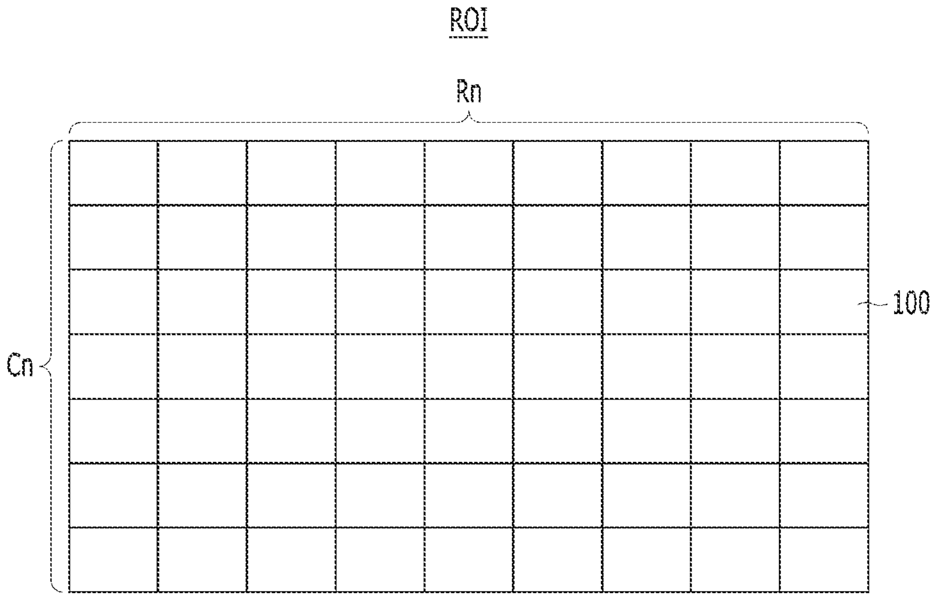

FIG. 10B is a diagram for describing a method of calculating a cross-talk average value of a set region ROI (Regions of Interesting). The set region ROI may include a plurality of unit pixel blocks 100. For easy understanding of the inventive concepts of the present disclosure, the set region ROI includes Rn×Cn unit pixels 100. Referring to FIG. 10B, the method of calculating a cross-talk average value within the set region ROI may include calculating the cross-talk average value by the following equations. For example, cross-talk average values $AVG\_RG_{x\text{-}talk}$ and $AVG\_BG_{x\text{-}talk}$ between red-green and between blue-green of a plurality of unit pixel blocks 100 included in the ROI can be calculated as:

$$AVG\_RG_{x-talk}=\frac{1}{ROI_{size}}\sum_{ROI}RG_{x-talk} \quad \text{Equation 3}$$

$$AVG\_BG_{x-talk}=\frac{1}{ROI_{size}}\sum_{ROI}BG_{x-talk} \quad \text{Equation 4}$$

When the number of unit pixel blocks 100 included in the ROI is small, cross-talk correction capability is poor, but the time required for cross-talk correction is short. That is, although the response speed can be fast, the image quality may not be sufficiently excellent. Conversely, when the number of unit pixel blocks 100 included in the ROI is large, the cross-talk correction capability is excellent, the time required for cross-talk correction is long. That is, excellent image quality can be obtained, but response speed may be slow. Accordingly, the number of unit pixel blocks 100 included in the ROI may be described according to various criteria so that the performance of the image sensing device 800 can be optimized.

Figures 10C, 10D:
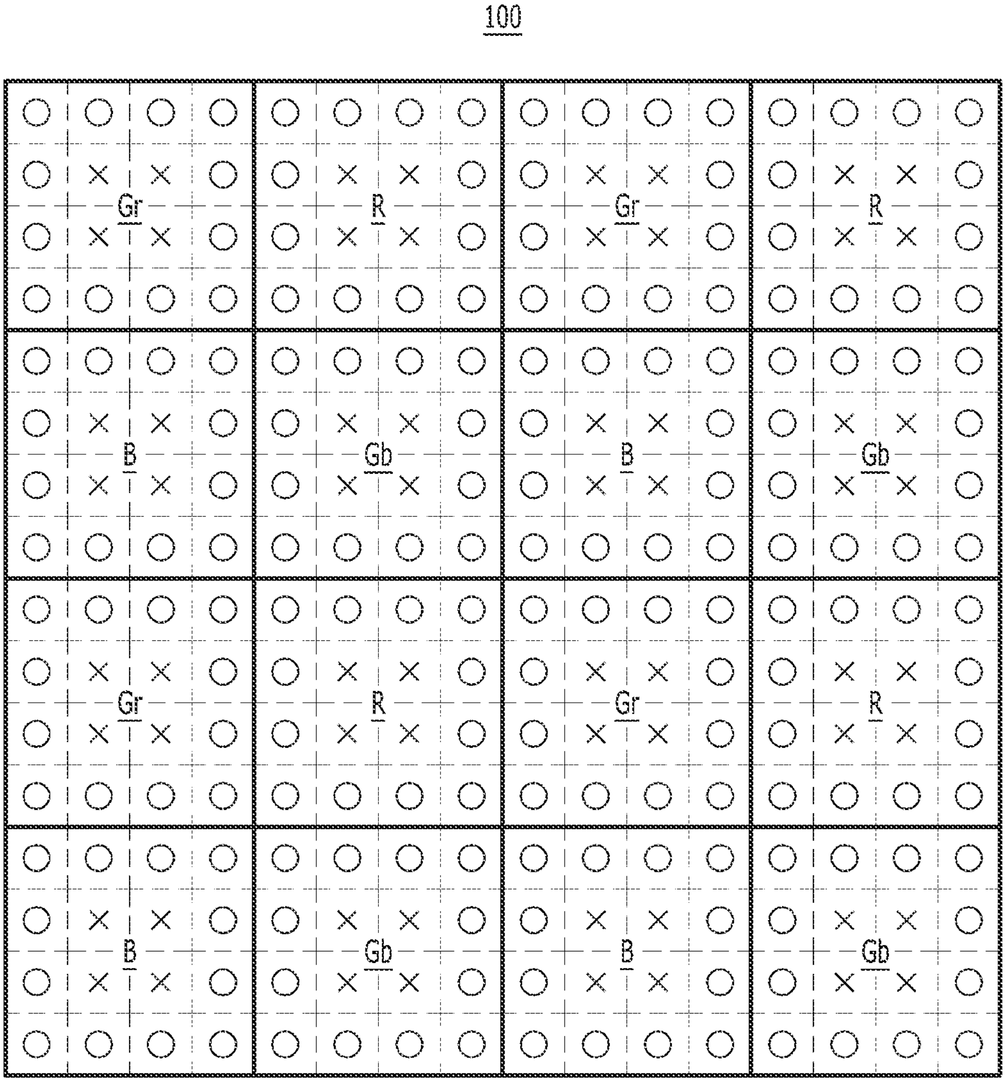

FIG. 10C is a diagram for describing correcting a cross-talk value of a cross-talk correction object OB located at a specific coordinate. The cross-talk correction object OB may be the ROI, the unit pixel block 100, the pixel groups IPx and XPx, or the unit pixels Gr, R, B, and Gb. Referring to FIG. 10C, the cross-talk value of the cross-talk correction object OB located at the coordinates (i, j) may be calculated and corrected by the following equations.

$$R'(i,j)=R(i,j)+\beta_1\times(\gamma AVG\_RG_{x-talk}(i,j)+AVG\_RG_{x-talk}(i,j-1)+AVG\_RG_{x-talk}(i-1,j)+AVG\_RG_{x-talk}(i+1,j)+AVG\_RG_{x-talk}(i,j+1)) \quad \text{Equation 5}$$

$$B'(i,j)=B(i,j)+\beta_2\times(\gamma AVG\_BG_{xtalk}(i,j)+AVG\_BG_{xtalk}(i,j-1)+AVG\_BG_{xtalk}(i-1,j)+AVG\_BG_{xtalk}(i+1,j)+AVG\_BG_{xtalk}(i,j+1)) \quad \text{Equation 6}$$

$$G'(i,j)=G(i,j)+\beta_3\times(\gamma AVG\_RG_{xtalk}(i,j)+AVG\_RG_{xtalk}(i,j-1)+AVG\_RG_{xtalk}(i-1,j)+AVG\_RG_{xtalk}(i+1,j)+AVG\_RG_{xtalk}(i,j+1))+\beta_3\times(\gamma AVG\_BG_{xtalk}(i,j)+AVG\_BG_{xtalk}(i,j-1)+AVG\_BG_{xtalk}(i-1,j)+AVG\_BG_{xtalk}(i+1,j)+AVG\_BG_{xtalk}(i,j+1)) \quad \text{Equation 7}$$

R'(i,j): A corrected red color value of the cross-talk correction object OB located at the coordinates (i, j).

B'(i,j): A corrected blue color value of the cross-talk correction object OB located at the coordinates (i, j).

G'(i,j): A corrected green color value of the cross-talk correction object OB located at the coordinates (i, j)

$\beta_1$, $\beta_2$, $\beta_3$: Process factors (weight). Generally, it is 1, but it can be changed according to the pre-test results.

$\gamma$: Process constant (weight). Generally, it is 1, but it may change according to the pre-test results.

That is, the color value of the central cross-talk correction object OB may be calculated and corrected using the average cross-talk sensing value of the unit pixel blocks 100 adjacent in the row direction and the column direction.

FIG. 10D is a diagram for describing correcting cross-talk of specific unit pixels in the unit pixel block 100. Referring to FIG. 10D, cross-talk may be corrected only for unit pixels located near boundaries of each of the pixels (i.e., color filters). In the unit pixel block 100 having the unit pixels Gr, R, B, Gb of QXQ (Quad by Quad), the unit pixels Gr, R, B, Gb) for which cross-talk correction is performed are marked with "O". Specifically, cross-talk correction may be performed on adjacent unit pixels Gr, R, B, and Gb having different colors. Since the unit pixels Gr, R, B, and Gb marked with "X" are not adjacent to pixels having different colors around them, cross-talk correction may not be performed. The cross-talk correction may be performed by considering the cross-talk value of the adjacent unit pixel block 100 using the equations described with reference to FIG. 10C.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. An image sensing device comprising:

a pixel array including a plurality of unit pixel blocks arranged in a matrix form, wherein each of the unit pixel blocks includes a plurality of imaging pixel groups and a cross-talk sensing pixel group, wherein the cross-talk sensing pixel group includes:

a first green sensing pixel including a first green color filter and a first yellow color filter;

a red sensing pixel including a second yellow color filter and a red color filter;

a blue sensing pixel including a blue color filter and a first cyan color filter; and a second green sensing pixel including a second cyan color filter and a second green color filter, wherein:

the first green sensing pixel includes a first half green sensing pixel including the first green color filter and a first half yellow sensing pixel including the first yellow color filter, the red sensing pixel includes a second half yellow sensing pixel including the second yellow color filter and a half red sensing pixel including the red color filter, the blue sensing pixel has a half blue sensing pixel including the blue color filter and a first half cyan sensing pixel including the first cyan color filter, and the second green sensing pixel includes a second half cyan sensing pixel including the second cyan color filter and a second half green sensing pixel including the second green color filter, wherein:

during operation, a color value of the first half green sensing pixel and a color value of the first half yellow sensing pixel are calculated and converted into a color value of a first green pixel, a color value of the second half yellow sensing pixel and a color value of the half red sensing pixel are calculated and converted into a color value of a red pixel, a color value of the half blue sensing pixel and a color value of the first half cyan pixel are calculated and converted into a color value of a blue pixel, and a color value of the second half cyan pixel and a color value of the second half green sensing pixel are calculated and converted into a second green pixel, wherein each of the plurality of imaging pixel groups includes a first green sensing pixel, a red sensing pixel, a blue sensing pixel, and a second green sensing pixel arranged in a matrix form, and wherein each area of the first half green sensing pixel, the first half yellow sensing pixel, the second half yellow sensing pixel, the half red sensing pixel, the half blue sensing pixel, the first half cyan sensing pixel, the second half cyan sensing pixel, and the second half green sensing pixel of the cross-talk sensing pixel group is less than ½ of each of areas of the first green sensing pixel, the red sensing pixel, the blue sensing pixel, and the second green sensing pixel of the plurality of imaging pixel groups.

2. The imaging sensing device of claim 1, wherein:

the first green pixel of each of the plurality of imaging pixel groups has a same size as the first green sensing pixel of the cross-talk sensing pixel group, the red pixel of each of the imaging pixel sensing groups has a same size as the red sensing pixel of the cross-talk sensing pixel group, the blue pixel of each of the imaging pixel sensing groups has a same size as the blue sensing pixel of the cross-talk sensing pixel group, and the second green pixel of each of the plurality of imaging pixel groups has a same size as the second green sensing pixel of the cross-talk sensing pixel group.

3. The imaging sensing device of claim 1, wherein:

the first yellow color filter and the second yellow color filter are adjacent to each other in a row direction, and the first cyan color filter and the second cyan color filter are adjacent to each other in the row direction.

4. The imaging sensing device of claim 1, wherein:

the first yellow color filter and the second yellow color filter are adjacent to each other in a column direction, and the first cyan color filter and the second cyan color filter are adjacent to each other in the column direction.

5. The imaging sensing device of claim 1, wherein:

the plurality of imaging pixel groups include a first imaging pixel group, a second imaging pixel group, and a third imaging pixel group, and the first to third imaging pixel groups and the cross-talk sensing pixel group are arranged in a matrix form having two rows and two columns.

6. The imaging sensing device of claim 1, wherein the plurality of imaging pixel groups include:

a first imaging pixel group disposed at an upper-left position in a unit pixel block;

a second imaging pixel group disposed at an upper-right position in the unit pixel block;

a third imaging pixel group disposed at a lower-left position in the unit pixel block; and a fourth imaging pixel group disposed at a lower-right position in the unit pixel block, and wherein the cross-talk sensing pixel group is disposed in a central position of the unit pixel block to be surrounded by the first to fourth imaging pixel groups.

7. The imaging sensing device of claim 6, wherein:

the first imaging pixel group includes a plurality of first green pixels arranged in a matrix form, the second imaging pixel group includes a plurality of red pixels arranged in a matrix form, the third imaging pixel group includes a plurality of blue pixels arranged in a matrix form, and the fourth imaging pixel group includes a plurality of second green pixels arranged in a matrix form.

8. The imaging sensing device of claim 7, wherein:

the first green sensing pixel of the cross-sensing pixel group is one of the first green pixels of the first imaging pixel group, the red sensing pixel of the cross-sensing pixel group is one of the red pixels of the second imaging pixel group, the blue sensing pixel of the cross-sensing pixel group is one of the blue pixels of the third imaging pixel group, and the second green sensing pixel of the cross-sensing pixel group is one of the second green pixels of the fourth imaging pixel group.

9. The imaging sensing device of claim 6, wherein:
each of the first to fourth imaging pixel groups include the first green pixel, the red pixel, the blue pixel, and the second green pixel arranged in a matrix form,
the first green sensing pixel of the cross-talk sensing pixel is the first green pixel of the fourth imaging pixel group,
the red sensing pixel of the cross-talk sensing pixel is the red pixel of the third imaging pixel group,
the blue sensing pixel of the cross-talk sensing pixel is the blue pixel of the second imaging pixel group, and
the second green sensing pixel of the cross-talk sensing pixel is the second green pixel of the first group of imaging pixels.

10. An imaging sensing device comprising:
a plurality of unit pixel blocks arranged in a matrix form,
wherein each of the unit pixel blocks includes a plurality of imaging pixel groups and a cross-talk sensing pixel group,
wherein the cross-talk sensing pixel group includes:
a first half green sensing pixel;
a first half yellow sensing pixel;
a second half yellow sensing pixel;
a half red sensing pixel;
a half blue sensing pixel;
a first half cyan sensing pixel;
a second half cyan sensing pixel; and
a second half green sensing pixel,
wherein:
during operation, a color value of the first half green sensing pixel and a color value of the first half yellow sensing pixel are calculated and converted into a color value of a first green pixel, a color value of the second half yellow sensing pixel and a color value of the half red sensing pixel are calculated and converted into a color value of a red pixel, a color value of the half blue sensing pixel and a color value of the first half cyan sensing pixel are calculated and converted into a color value of a blue pixel, and a color value of the second half cyan sensing pixel and a color value of the second half green sensing pixel are calculated and converted into a second green pixel,
wherein each of the plurality of imaging pixel groups includes a first green pixel, a red pixel, a blue pixel, and a second green pixel arranged in a matrix form, and
wherein each area of the first half green sensing pixel, the first half yellow sensing pixel, the second half yellow sensing pixel, the half red sensing pixel, the half blue sensing pixel, the first half cyan sensing pixel, the second half cyan sensing pixel, and the second half green sensing pixel of the cross-talk sensing pixel group is less than ½ of each of areas of the first green pixel, the red pixel, the blue pixel, and the second green pixel of the plurality of imaging pixel groups.

11. The imaging sensing device of claim 10, wherein:
the first half green sensing pixel, the first half yellow sensing pixel, the second half yellow sensing pixel, and the half red sensing pixel are arranged in a same direction, and
the half blue sensing pixel, the first half cyan sensing pixel, the second half cyan sensing pixel, and the second half green sensing pixel are arranged in a same direction.

12. The imaging sensing device of claim 10,
wherein:
the area of the first green pixel of each of the plurality of imaging pixel groups has a size equal to sum of an area of the first half green sensing pixel of the cross-talk sensing pixel group and an area of the first half yellow sensing pixel,
the area of the red pixel of each of the plurality of imaging pixel groups has a size equal to sum of the area of the second half yellow sensing pixel of the cross-talk sensing pixel group and the area of the half red sensing pixel,
the area of the blue pixel of each of the plurality of imaging pixel groups has a size equal to sum of the area of the half blue sensing pixel of the cross-talk sensing pixel group and the area of the first half cyan sensing pixel, and
the area of the second green pixel of each of the plurality of imaging pixel groups has a size equal to sum of the area of the second half cyan sensing pixel of the cross-talk sensing pixel group and the area of the second half green sensing pixel.

13. The imaging sensing device of claim 10,
wherein the plurality of imaging pixel groups include:
a first imaging pixel group disposed at an upper-left position in a unit pixel block;
a second imaging pixel group disposed at an upper-right position in the unit pixel block;
a third imaging pixel group disposed at a lower-left position in the unit pixel block; and
a fourth imaging pixel group disposed at a lower-right position in the unit pixel block,
wherein the cross-talk sensing pixel group is disposed at a central position of the unit pixel block to be surrounded by the first to fourth imaging pixel groups, and
wherein one pixel of the first imaging pixel group, one pixel of the second imaging pixel group, one pixel of the third imaging pixel group, and one pixel of the fourth imaging pixel group form the cross-talk sensing pixel group.

14. An imaging sensing device comprising:
a substrate;
photodiodes formed in the substrate;
a planarization layer formed over an upper surface of the substrate;
color filters formed over the planarization layer; and
micro lenses formed over the color filters,
wherein the color filters include:
imaging color filters selectively including one of a green color, a red color, and a blue color, and
cross-talk sensing color filters,
wherein each of the cross-talk sensing color filters include one of a first green sensing color filter, a red sensing color filter, a blue sensing color filter, a second green sensing color filter, at least one yellow sensing color filter, and at least one cyan sensing color filter,
wherein first and fourth cross-talk sensing color filters adjacent to first and second imaging color filters include the same colors as the first and second imaging color filters, and second and third cross-talk sensing color filters disposed between the first and fourth cross-talk sensing color filters include mixed colors of the first and fourth cross-talk sensing color filters, and
wherein a horizontal width of the first and fourth cross-talk sensing color filters is less than or equal to ½ of a horizontal width of the first and second imaging color filters.

15. The imaging sensing device of claim 14, wherein:
the photodiodes include imaging photodiodes and cross-talk sensing photodiodes, and a volume of each of the cross-talk sensing photodiodes is smaller than a volume of each of the imaging photodiodes.

16. The imaging sensing device of claim 15, wherein:

the micro lenses include imaging micro lenses and cross-talk sensing micro lenses, and a volume of each of the cross-talk sensing micro lenses is smaller than a volume of each of the imaging micro lenses.

17. The imaging sensing device of claim 16, wherein:

the imaging micro lenses, the imaging color filters, and the imaging photodiodes are each vertically aligned, and the cross-talk sensing micro lenses, the cross-talk sensing color filters, and the cross-talk sensing photodiodes are each vertically aligned.

18. The imaging sensing device of claim 15, further comprising:

imaging transfer gates electrically connected to the imaging photodiodes, respectively, and cross-talk sensing transfer gates electrically connected to the cross-talk sensing photodiodes, respectively.

19. The imaging sensing device of claim 18, further comprising:

imaging floating diffusion regions electrically connected to the imaging transfer gates, respectively, and cross-talk sensing floating diffusion regions electrically connected to the cross-talk sensing photodiodes, respectively.

* * * * *